(12) United States Patent
Imondi et al.

(10) Patent No.: US 8,451,661 B2
(45) Date of Patent: *May 28, 2013

(54) PROGRAMMING METHODS AND MEMORIES

(75) Inventors: Giuliano G. Imondi, Rieti (IT); Alessandro Torsi, Avezzano (IT)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 13/408,492

(22) Filed: Feb. 29, 2012

(65) Prior Publication Data

US 2012/0163094 A1 Jun. 28, 2012

Related U.S. Application Data

(63) Continuation of application No. 12/633,239, filed on Dec. 8, 2009, now Pat. No. 8,139,419.

(51) Int. Cl.
*G11C 16/00* (2006.01)

(52) U.S. Cl.
USPC ............. 365/185.19; 365/185.18; 365/185.28

(58) Field of Classification Search
USPC ...................................... 365/185.02
See application file for complete search history.

(56) References Cited

U.S. PATENT DOCUMENTS

| | | | |
|---|---|---|---|
| 7,304,894 B2 | 12/2007 | Joo | |
| 7,324,383 B2 | 1/2008 | Incarnati et al. | |
| 7,778,082 B2 | 8/2010 | Shin et al. | |
| 7,911,850 B2 * | 3/2011 | Chae et al. | 365/185.23 |
| 7,944,757 B2 | 5/2011 | Moschiano et al. | |
| 8,111,557 B2 * | 2/2012 | Ahn | 365/185.22 |
| 8,139,419 B2 * | 3/2012 | Imondi et al. | 365/185.19 |

* cited by examiner

*Primary Examiner* — Tan T. Nguyen
(74) *Attorney, Agent, or Firm* — Leffert Jay & Polglaze, P.A.

(57) ABSTRACT

Methods of programming memory cells, and memories incorporating such methods, are disclosed. In at least one embodiment, programming is accomplished by applying a set of incrementing program pulses to program a selected cell to a first target threshold voltage, and applying a set of incrementing inhibit pulses to an unselected cell to fine-tune program the selected cell to a second threshold voltage.

20 Claims, 5 Drawing Sheets

|   | | Program pulse ratio 1:1 | | Inhibit pulse ratio 7:1 |
|---|---|---|---|---|
| DAC # of bits | DAC # of steps | mV/step for V_MAX=20V | mV/step for V_MAX=12V | equivalent mV/step for cell Vt for inhibit pulse |
| 1 | 2 | 10000 | 6000 | |
| 2 | 4 | 5000 | 3000 | |
| 3 | 8 | 2500 | 1500 | |
| 4 | 16 | 1250 | 750 | ~105 |
| 5 | 32 | 625 | 375 | ~55 |
| 6 | 64 | 313 | 188 | ~27 |
| 7 | 128 | 156 | ~94 | ~14 |
| 8 | 256 | ~80 | ~47 | ~7 |

PROGRAMMING METHODS AND MEMORIES

RELATED APPLICATIONS

This Application is a Continuation of U.S. application Ser. No. 12/633,239, titled "PROGRAMMING METHODS AND MEMORIES," filed Dec. 8, 2009, now U.S. Pat. No. 8,139,419, (Allowed) which is commonly assigned and incorporated herein by reference.

FIELD

The present disclosure relates generally to semiconductor memories and in particular the present disclosure relates to memories and programming in memories.

BACKGROUND

In modern NAND flash memory devices, when cells along an access line (such as those lines referred to as word lines) are to be programmed, a voltage pulse is applied to those cells, such as by applying a pulse to the cell through the selected word line to perform the programming operation. The program pulse modifies the cell threshold voltage, for example, the threshold of the floating gate transistor of the memory cell. A series of program pulses of increasing voltage is applied until the selected cell is programmed to a desired threshold voltage, determined by a verification process after each successive programming pulse. An inhibit pulse is applied to unselected word lines in the same block of the memory array. The inhibit pulse serves to avoid unintentional programming of cells on the unselected word lines.

As NAND flash memories progress toward ever-increasing array density, multiple levels are being programmed into each memory cell. NAND flash technology is evolving from a single level cell (either programmed or not programmed) to multi level cells (MLC) that store two or more bits per cell.

The actual cell threshold voltage value achieved in a programmed cell is a direct function of the programming pulse voltage value. That is, once a certain threshold voltage value is reached by the programming pulse, the cell threshold voltage changes by about a 1:1 ratio with increments in the voltage of the programming pulse.

Single bit storage is accomplished by modifying the cell threshold voltage between two possible levels representing logical 0 and logical 1 levels. For storage of two bits per cell, four levels are used. For three bits per cell, eight levels are used, and so on. Since a limited amount of threshold voltage is available, an increased number of levels within a threshold voltage range means that an increasingly higher level of precision in achieving those levels is needed.

For the reasons stated above, and for other reasons stated below which will become apparent to those skilled in the art upon reading and understanding the present specification, there is a need in the art for increased precision in programming cell threshold voltages.

DETAILED DESCRIPTION

In the following detailed description of the embodiments, reference is made to the accompanying drawings that form a part hereof In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The following detailed description is, therefore, not to be taken in a limiting sense, and the scope of the present disclosure is defined only by the appended claims, along with the full scope of equivalents to which such claims are entitled.

Embodiments described herein use inhibit voltage pulses to fine tune programming of selected cells in a memory array, once program pulses program the cell threshold voltage to within a determined voltage of the desired threshold voltage.

Cell threshold voltage in an equilibrium mode of programming has, at each program pulse, a charge storage node (e.g., a floating gate or charge trap) to channel potential drop that is approximately the same. In the equilibrium mode of programming, the effect on threshold voltage of the cell being programmed is in approximately a 1:1 ratio with the increase in the voltage of the programming pulse ($V_{pgm\_step}$). Similarly, the change in threshold voltage of a cell is affected by a change in an inhibit voltage applied to all the unselected word lines coupled to cells in the same memory sector (in NAND flash, memory cells are arrayed in series of, for example, 32 or 64 cells, each belonging to a different word line; a memory sector is the memory array sector made by the, for example, 32 or 64 word lines belonging to the same series) in a predictable amount. Due at least to coupling between word lines, when an incremented inhibit pulse is applied to word lines immediately adjacent to the word line (one for each side) coupled to the cell being programmed, a threshold voltage change of about one seventh (1/7) of that caused by a program pulse incremented by the same increment and applied to a selected cell is effected by the incremented inhibit pulse. Note that the, for example, 64 cells in series typically have a dummy cell at each end of the string, so that all the word lines have two adjacent word lines.

Figure 1A:
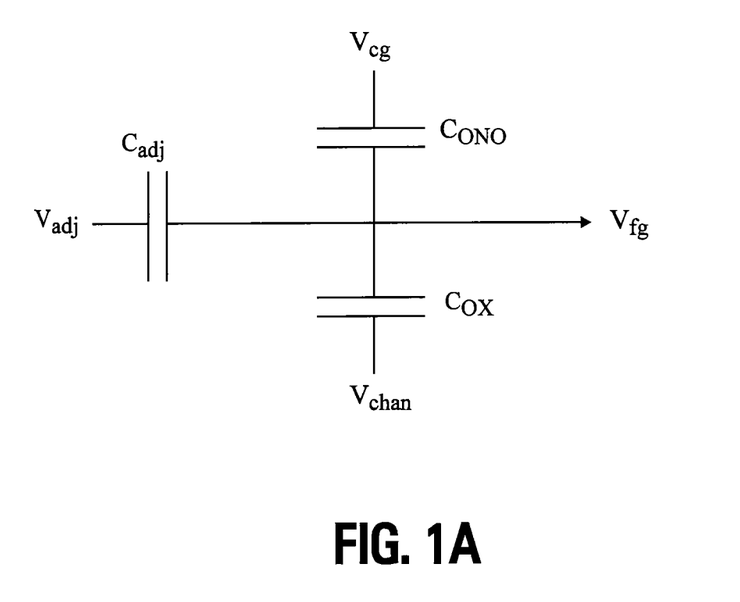
FIG. 1A is a diagram of capacitances on memory cells according to one embodiment of the present disclosure.

Referring to the structure of a memory array shown in FIG. 1A, and describing an example with respect to that structure, during a disturb phase, a program voltage $V_{pgm}$ is applied to the control gate. The tunnel oxide potential drop is represented in equation [1].

$$\Delta V = \alpha_c(V_{pgm} - V_{chan}) + \frac{Q}{C_{tot}} + \beta_c(V_{inh} - V_{chan}) \quad [1]$$

where:
$C_{ono}$=cell capacitance between control gate and charge storage node
$C_{ax}$=cell capacitance between charge storage node and channel $C_{adj}$=capacitance between adjacent word line and charge storage node $$C_{tot} = C_{ono} + C_{ax} + C_{adj}$$

$$\alpha_c = \frac{C_{ono}}{C_{tot}}$$

$$\beta_c = \frac{C_{adj}}{C_{tot}}$$

Q is the charge storage node charge

In equilibrium mode, at each programming pulse the charge storage node to channel potential drop is approximately equal, since an increment of programming pulse corresponds to an increment of charge storage node charge (from Q to Q+ΔQ) so:

$$\Delta V_1 = \alpha_c V_{pgm} + \frac{Q}{C_{tot}} + \beta_c V_{inh}$$

$$\Delta V_2 = \alpha_c (V_{pgm} + \Delta V_{pgm}) + \frac{Q + \Delta Q}{C_{tot}} + \beta_c (V_{inh} + \Delta V_{inh})$$

Equating $\Delta V_1$ and $\Delta V_2$ yields $$-\frac{\Delta Q}{C_{tot}} = \alpha_c \Delta V_{pgm} + \beta_c \Delta V_{inh}$$

$$-\Delta Q = C_{tot}(\alpha_c \Delta V_{pgm} + \beta_c \Delta V_{inh}) = C_{ono}\Delta V_{pgm} + C_{adj}\Delta V_{inh}$$

$$\Delta VT = -\frac{\Delta Q}{C_{ono}} = \Delta V_{pgm} + \frac{C_{adj}}{C_{ono}}\Delta V_{inh}$$

Plotting $\Delta V_t$ versus $V_{inh}$ and with a fixed $V_{pgm}$, a ratio of the measure $C_{adj}/C_{ono}$ is obtained. By changing inhibit voltage $V_{inh}$ by a determined amount, $V_t$ may be fine tuned using the inhibit voltage. The ratio of $C_{adj}/C_{ono}$ will change depending upon changes in technology and is different from one technology to another, but current NAND memories in one embodiment have an inhibit voltage increment effect of approximately one seventh (⅐) that of the programming voltage increment effect.

While embodiments of the present disclosure are illustrated using a ratio of one seventh (⅐) for the affect of incremented inhibit voltage pulses versus incremented programming voltage pulses, it should be understood that other ratios are amenable to use with the various methods and apparatuses herein without departing from the scope of the disclosure.

Figure 1B:
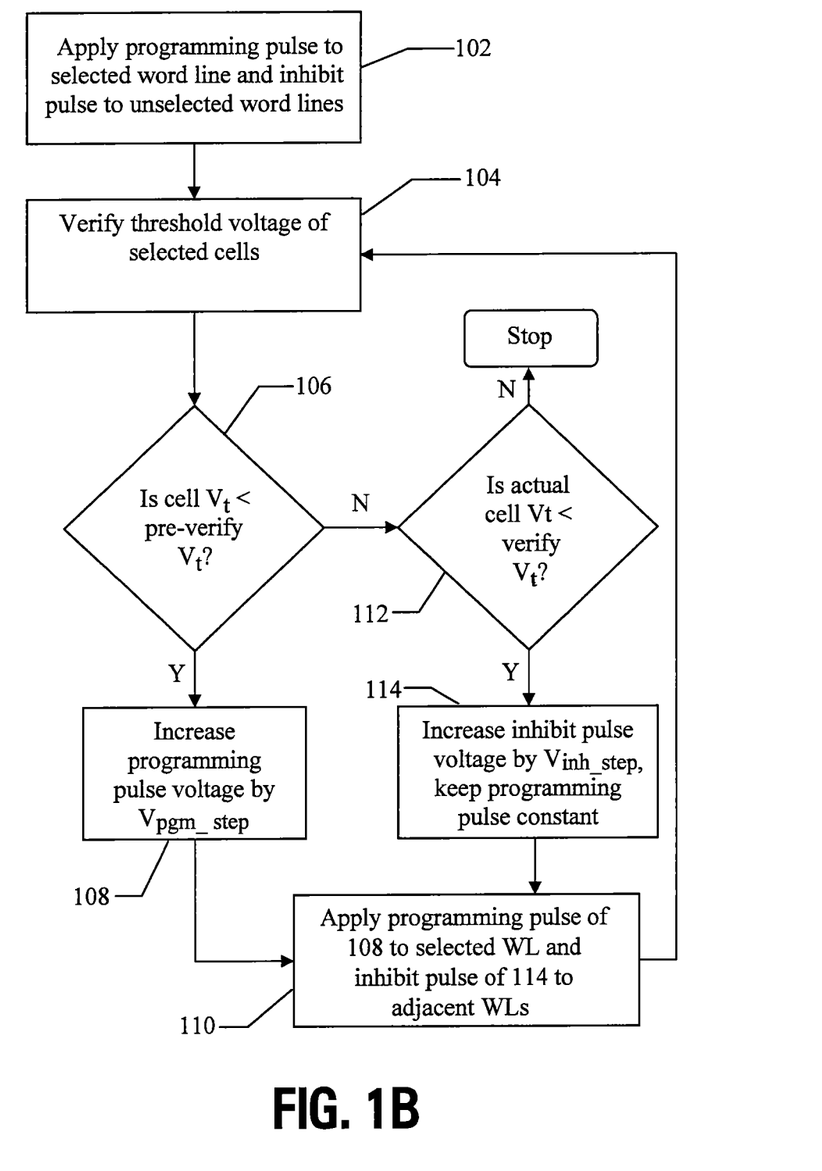
FIG. 1B is a flow chart diagram of a method according to one embodiment of the present disclosure.

Control of fine tuning of threshold voltages in NAND memories is performed in one embodiment as follows. In operation, a method 100 of programming a memory is shown in FIG. 1B. Method 100 comprises applying a programming pulse to a selected word line (and thereby to the control gate of the selected cell(s)) while applying an inhibit pulse to the two immediately adjacent unselected word lines (and therefore adjacent unselected cells) in block 102, and verifying a threshold voltage of selected cells in block 104. It should be understood that initial values for the programming pulse and the inhibit pulse are selected in ways known in the art, and may differ for differing memories without departing from the scope of the disclosure. The cell threshold voltage is compared to a first target voltage in block 106. If the cell $V_t$ is less than the first target (e.g., pre-verify) voltage, which is lower than a second target (e.g., verify) voltage (i.e., the threshold voltage to which the programming operation is attempting to program the cell to, at least in that iteration), the program voltage is increased by a program voltage step $V_{pgm\_step}$, while the inhibit voltage remains the same, in block 108, and another program pulse is applied in block 110. If the cell $V_t$ is not less than the first target voltage, then it is determined in decision block 112 whether the cell $V_t$ is less than the second target voltage. If not, the process ends. If so, the program voltage is not incremented, while the inhibit voltage is incremented up by an inhibit voltage step $V_{inh\_step}$ in block 114. The programming pulse of block 108 is applied to the selected word line, and the inhibit pulse of block 114 is applied to the adjacent unselected word lines in block 110. Following each program and inhibit pulse applied in block 110, the process flow continues at block 104.

The program pulses are successively increased until such time as the $V_t$ for the selected cell has reached the first target voltage, which in one embodiment is close to the second target voltage. Once the selected cell has reached the first target voltage, but not exceeded the second target voltage, program pulses remain the same while inhibit pulses of successive higher voltage are used to more finely program the selected cell to the second target voltage. In one embodiment, the amount of movement in the threshold voltage of the selected cell when incrementing an inhibit pulse is approximately one seventh (⅐) that of the amount of movement in the threshold voltage of the selected cell when incrementing a programming pulse by the same increment.

In this embodiment, on the selected word line, the main programming pulse, typically ranging from about 15 Volts to about 20 Volts, is applied. On unselected word lines, an inhibit pulse typically between 9 Volts and 10 Volts, is applied, to avoid programming of the cells on unselected word lines, but also, once the cells on the selected word line are within a determined difference in threshold voltage from their desired threshold voltage, an incremented inhibit pulse is applied to at least the unselected word lines adjacent to the selected word line. This application moves the threshold voltage on the selected word line cells by an amount approximately one seventh (⅐) that of a similarly incremented programming pulse, and fine tunes the threshold voltages of cells on the selected word lines. At the same time, the inhibit pulse still inhibits programming of cells on the unselected word lines. Voltages applied on cell data lines (such as those referred to as bit lines) are controlled in typical fashion to distinguish between single cells on the selected word line that are to be programmed or not.

Implementation of hardware/firmware/software to perform the control of programming and inhibit pulses may be accomplished in a variety of ways. With the increasingly tight tolerances and voltage ranges for multi level cell technology, threshold voltages are being programmed to tolerances in the 10 mV range. With a typical programming pulse voltage range of about 20 Volts, to allow program pulses using a step of approximately 10 mV, a digital to analog converter (DAC) of 11 bits would be needed to have a sufficient amount of resolution to program in 10 mV increments, since in the programming range, there is approximately a 1:1 ratio of $\Delta V_{pgm\_step}$ to $\Delta V_t$. As the number of bits per cell increases, the complexity, size, and operation of DACs becomes far more complicated. Typical offset of differential amplifiers as well as noise contribute to the problems with DACs of larger numbers of bits.

Since an increment of an inhibit pulse has been shown to have an effect on the threshold voltage of a selected cell being programmed to some fraction of, e.g., about one seventh (⅐), that of the same increment of a program pulse, and since inhibit pulses in one embodiment are applied in a range of about 9 Volts to 10 Volts, and up to approximately 12 Volts, a voltage pulse generator can be used that generates pulses having a minimum step ($\Delta V_{inh\_step}$) of about seven times that of the programming pulse, in this example, or approximately 70 mV.

It should be understood that use of incrementing inhibit pulses for fine tuning programming of selected cells is typically available using only a range of inhibit voltages that also properly inhibit unselected word lines from programming, and as such the inhibit voltage is not typically suitable for initial programming. A certain inhibit pulse voltage is used to inhibit programming of unselected word lines, so the inhibit voltage that can be used for fine tuning cells on the selected word line typically works in a range around the inhibit pulse value that is suitable for a proper inhibit operation.

For example, suppose an inhibit pulse is at a voltage of 9 volts. A voltage range of approximately +/−260 mV around the 9 Volt voltage may be used in one embodiment for fine tuning the threshold voltage of cells on the selected word line without affecting the main purpose of the inhibit voltage for the unselected word lines. If the coupling ratio is 1/7, to change cell Vt up to 80 mV (i.e. the minimum step of the suggested program pulse DAC), approximately 11-12 inhibit pulse steps, each one of them of approximately 47 mV, are used. Given this, if a typical inhibit pulse is 9 volts, the inhibit pulse changes between approximately 8.74V and approximately 9.26V, where 8.74V is the inhibit pulse utilized while only the program pulse is changing. Note that additional ranges for inhibit voltages are also acceptable in various embodiments, such as inhibit voltages in a range between approximately 9V and approximately 9.52V.

Figure 2:
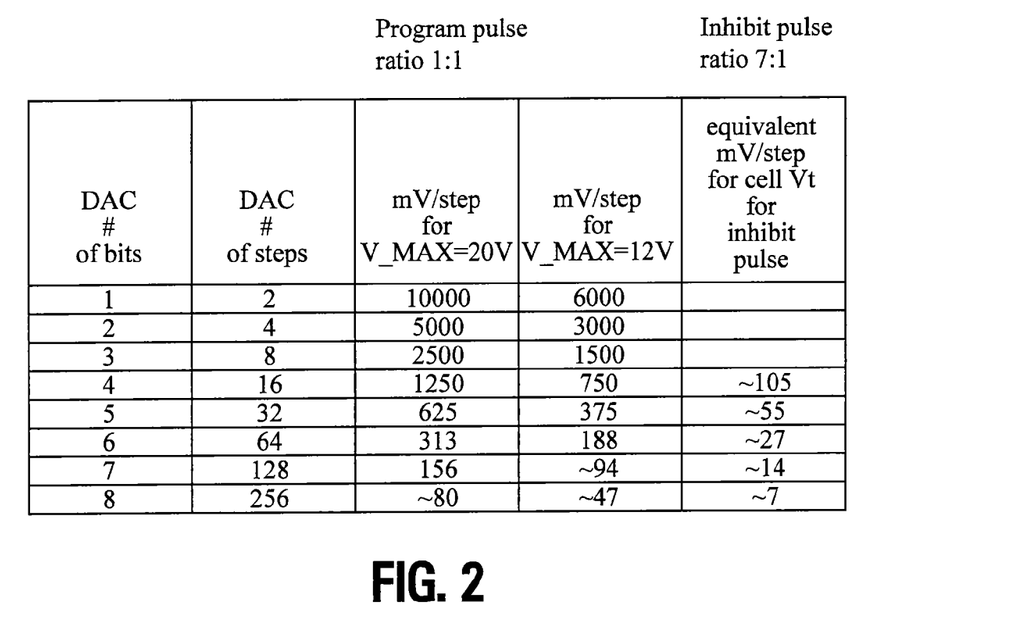
FIG. 2 is a table showing voltage steps for DACs according to another embodiment of the present disclosure.

In one embodiment of the present invention, instead of using a single 11 bit DAC, two separate eight bit DACs are used, the first for use to generate program pulses with minimum programming pulse steps of approximately 80 mV using a maximum output value of approximately 20 Volts, and the second for use to generate inhibit pulses with minimum inhibit pulse steps of approximately 47 mV using a maximum output value of approximately 12 Volts, as shown in FIG. 2.

Two eight bit DACs are easier to design, and are smaller combined than a single 11 bit DAC. So, for NAND technology in which incremented inhibit pulses have approximately a one seventh (1/7) effect of incremented program pulses, a savings of three bits is made for DACs. That is, where an 11 bit DAC would be necessary to have a proper threshold voltage resolution, two eight bit DACs may be used. With combinations of the two DACs, it is further possible to fine tune cell threshold voltages by a minimum step lower even than the 10 mV step of a higher resolution 11 bit DAC using the two lower resolution eight bit DACs. As the number of bits per cell increases, such a savings in DAC bits may be of even further benefit.

While two eight bit DACs are described as used in one embodiment, it should be understood that other configurations of one or more DAC may be used without departing from the scope of the disclosure. One of skill in the art will recognize that such different configurations are easily adapted to use with the various methods and apparatuses of the present disclosure.

Figure 3:
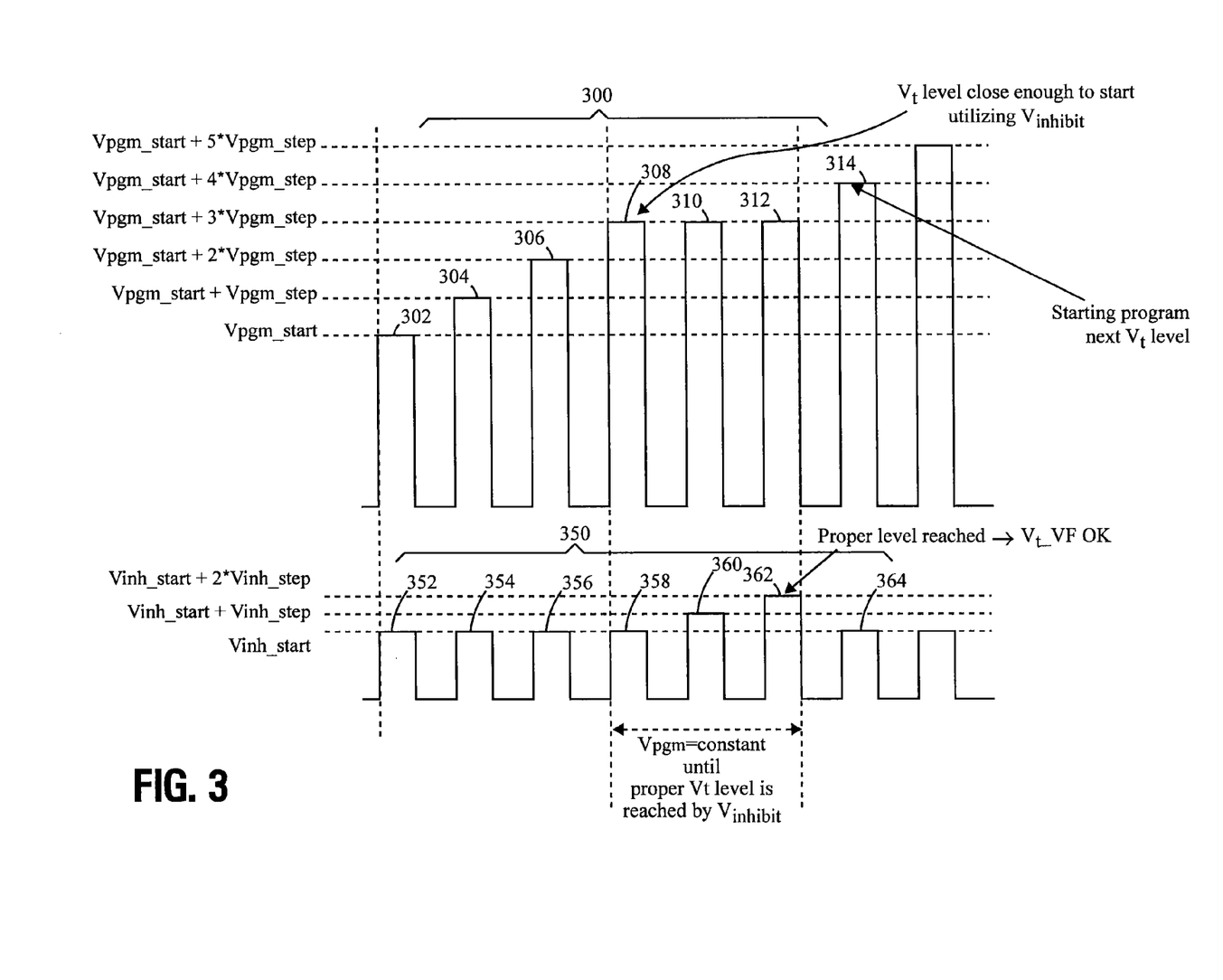
FIG. 3 is a graph showing a series of program pulses and inhibit pulses according to another embodiment of the present disclosure.

A graph showing a series of program pulses 300 and inhibit pulses 350 is shown in FIG. 3. The series 300 of program pulses increases from an initial pulse 302 at voltage $V_{pgm}$ by a program step-up voltage of $V_{pgm\_step}$ at each successive programming pulse 304, 306, and 308. Once the selected cell (the cell being programmed) reaches a first target threshold voltage lower than a second target threshold voltage but close enough to be fine-tuned with incremented inhibit pulses, the program pulse voltage is kept constant, as in pulses 310 and 312. The series 350 of inhibit pulses remains constant starting with initial inhibit pulse 352, through inhibit pulses 354, 356, and 358. Once the selected cell (the cell being programmed) reaches the first target threshold voltage, the inhibit pulses are incremented by an inhibit step-up voltage $V_{inh\_step}$ at each successive inhibit pulse, 360 and 362, until the selected cell is verified to the second target threshold voltage. If the cell is to be programmed to still another level, the program pulse 314 and inhibit pulse 364 is then used. It should be understood that a larger or smaller number of program and inhibit pulses can be applied in various embodiments.

Determination of the first target (e.g., pre-verify) voltage is within the skill of one of ordinary skill in the art, and will differ based on, for example only, the number of bits per cell being programmed, the NAND technology, the program voltage range, word line coupling factors, and the like.

Figure 4:
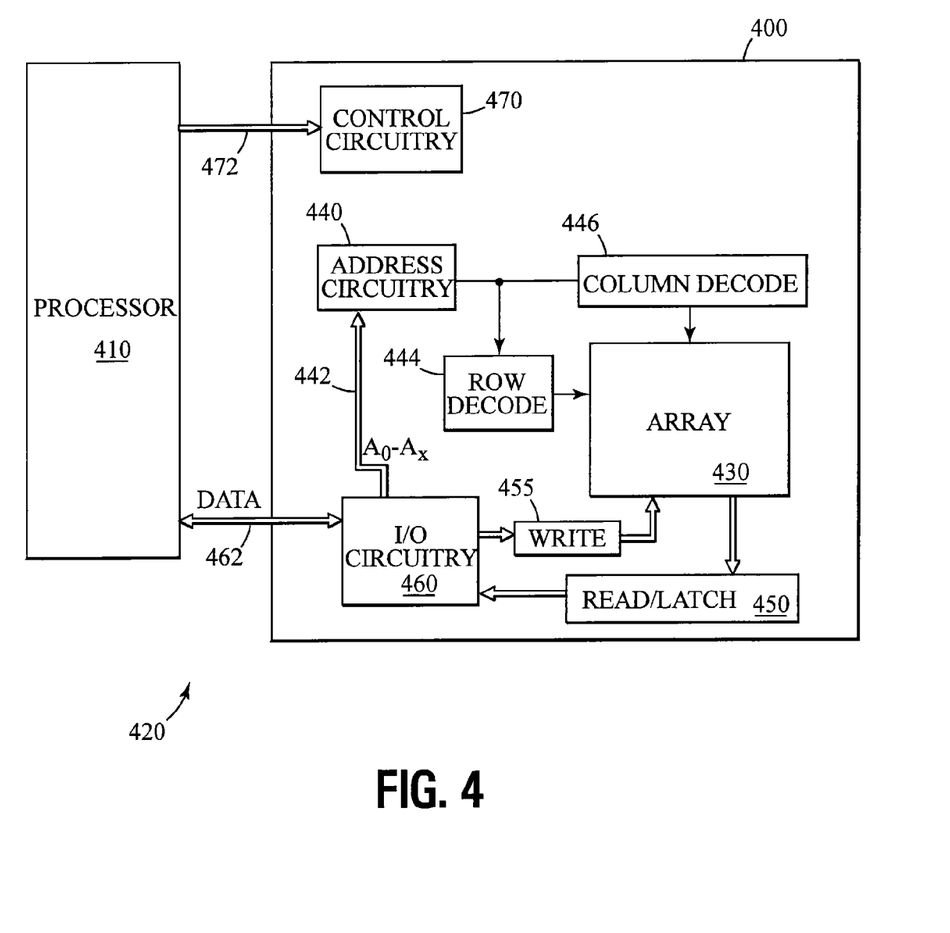
FIG. 4 is a functional block diagram of an electrical system having at least one memory device on which embodiments of the present disclosure are practiced.

FIG. 4 is a functional block diagram of a memory device 400, such as a flash memory device, of one embodiment of the present invention, and on which various method embodiments may be practiced, which is coupled to a processor 410. The memory device 400 and the processor 410 may form part of an electronic system 420. The memory device 400 has been simplified to focus on features of the memory that are helpful in understanding the present invention. The memory device includes an array of memory cells 430 having DACs and/or performing the methods of programming memories such as those shown in FIGS. 1-3 and described herein. The memory array 430 is arranged in banks of rows and columns.

An address buffer circuit 440 is provided to latch address signals provided over I/O connections 462 through I/O circuitry 460 to buffer circuit 440 via bus 442. Address signals are received and decoded by row decoder 444 and a column decoder 446 to access the memory array 430. It will be appreciated by those skilled in the art, with the benefit of the present description, that the number of address input connections depends upon the density and architecture of the memory array. That is, the number of addresses increases with both increased memory cell counts and increased bank and block counts.

The memory device reads data in the array 430 by sensing voltage or current changes in the memory array columns using sense/latch circuitry 450. The sense/latch circuitry, in one embodiment, is coupled to read and latch a row of data from the memory array. Data input and output buffer circuitry 460 is included for bi-directional data communication over a plurality of data (DQ) connections 462 with the processor 410, and is connected to write circuitry 455 and sense/latch circuitry 450 for performing read and write operations on the memory 400.

Command control circuit 470 decodes signals provided on control connections 472 from the processor 410. These signals are used to control the operations on the memory array 430, including data read, data write, and erase operations. The flash memory device has been simplified to facilitate a basic understanding of the features of the memory. A more detailed understanding of internal circuitry and functions of flash memories are known to those skilled in the art.

Conclusion

Methods and memories have been described that include programming a selected cell to at least a first target voltage with a plurality of incrementing program pulses, and incrementing an inhibit pulse applied to an unselected cell adjacent to the selected cell to program the selected cell to a second target voltage responsive to the selected cell being programmed to at least the first target voltage.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method for programming a memory, comprising:
   incrementing a program voltage on a selected cell and inhibiting adjacent unselected cells with a non-increasing inhibit voltage until the selected cell reaches a first target voltage; and
   incrementing the inhibit voltage on adjacent unselected cells and applying a non-increasing program voltage to the selected cell until the selected cell reaches a second target voltage.

2. The method of claim 1, wherein incrementing a program voltage comprises increasing the programming voltage for a plurality of program pulses.

3. The method of claim 1, wherein the first target voltage is within a determined voltage of the second target voltage for the selected cell.

4. The method of claim 1, wherein the first target voltage is a pre-verify threshold voltage, and wherein the second target voltage is a verify threshold voltage higher than the pre-verify threshold voltage.

5. The method of claim 1, wherein the incrementing the inhibit voltage affects a threshold voltage of the selected cell by a fraction of the effect of the incrementing program voltage.

6. A method of programming a memory, comprising:
   programming a selected cell to a first target voltage with program pulses; and
   fine-tuning programming of the selected cell to a second, higher target voltage with inhibit pulses to adjacent cells.

7. The method of claim 6, wherein programming the selected cell to a first target voltage comprises:
   applying a program pulse to the selected cell;
   applying an inhibit pulse to cells immediately adjacent to the selected cell;
   verifying a threshold voltage of the selected cell;
   comparing the threshold voltage of the selected cell to a first target voltage; and
   applying another program pulse with an increased voltage and an inhibit pulse of the same voltage as the previous inhibit pulse to the selected cell when the selected cell has a threshold voltage less than the first target voltage.

8. The method of claim 7, wherein fine-tuning programming further comprises applying incrementing inhibit pulses to the adjacent cells while applying a constant programming pulse to the selected cell.

9. The method of claim 6, wherein incrementing the inhibit voltage applied to adjacent cells and applying a non-increasing program voltage to the selected cell comprises applying a plurality of incrementing inhibit pulses and a plurality of constant program pulses.

10. The method of claim 6, wherein programming a selected cell to a first target voltage further comprises applying constant inhibit pulses to the adjacent cells with the incrementing program pulses.

11. The method of claim 6, wherein program pulses and inhibit pulses are generated using separate digital to analog converters.

12. The method of claim 6, wherein the inhibit pulses remain constant for programming the selected cell to the first target voltage.

13. The method of claim 6, wherein fine-tuning with inhibit pulses affects the threshold voltage of the selected cell by a fraction of the effect of a program pulse.

14. An apparatus, comprising:
   an array of memory cells; and
   a controller configured to:
      program a selected cell to a first target voltage; and
      fine-tune program of the selected cell to a second, higher target voltage with inhibit pulses to adjacent cells.

15. The apparatus of claim 14, wherein the controller is further configured to program the selected cell to a first target voltage by:
   applying a program pulse to the selected cell;
   applying an inhibit pulse to cells immediately adjacent to the selected cell;
   verifying a threshold voltage of the selected cell;
   comparing the threshold voltage of the selected cell to a first target voltage; and
   applying another program pulse with an increased voltage and an inhibit pulse of the same voltage as the previous inhibit pulse to the selected cell when the selected cell has a threshold voltage less than the first target voltage.

16. The apparatus of claim 15, wherein the controller is further configured to apply incrementing inhibit pulses to the adjacent cells while applying a constant programming pulse to the selected cell.

17. The apparatus of claim 14, wherein the controller is further configured to increment the inhibit voltage applied to adjacent cells and apply a non-increasing program voltage to the selected cell by applying a plurality of incrementing inhibit pulses and a plurality of constant program pulses.

18. The apparatus of claim 14, wherein the controller is further configured to program a selected cell to a first target voltage by applying constant inhibit pulses to the adjacent cells with the incrementing program pulses.

19. The apparatus of claim 15, and further comprising separate digital to analog converters to generate program pulses and inhibit pulses.

20. The apparatus of claim 14, wherein the controller is further configured to apply constant voltage inhibit pulses for programming the selected cell to the first target voltage.

* * * * *

UNITED STATES PATENT AND TRADEMARK OFFICE
CERTIFICATE OF CORRECTION

PATENT NO. : 8,451,661 B2
APPLICATION NO. : 13/408492
DATED : May 28, 2013
INVENTOR(S) : Giuliano G. Imondi et al.

Page 1 of 1

It is certified that error appears in the above-identified patent and that said Letters Patent is hereby corrected as shown below:

On Title Page, Item (57), under "Abstract", column 2, line 6, after "program" insert -- of --.

In the Claims

In column 8, line 50, in Claim 19, before "further" delete "and".

Signed and Sealed this
Thirtieth Day of July, 2013

Teresa Stanek Rea
*Acting Director of the United States Patent and Trademark Office*